United States Patent [19]

Shinagawa et al.

[11] Patent Number: 4,961,820

[45] Date of Patent: Oct. 9, 1990

[54] ASHING METHOD FOR REMOVING AN ORGANIC FILM ON A SUBSTANCE OF A SEMICONDUCTOR DEVICE UNDER FABRICATION

[75] Inventors: Keisuke Shinagawa, Kawasaki; Shuzo Fujimura, Tokyo; Kenichi Hikazutani, Kuwana, all of Japan

[73] Assignee: Fujitsu Limited, Kawasaki, Japan

[21] Appl. No.: 361,178

[22] Filed: Jun. 5, 1989

[30] Foreign Application Priority Data

Jun. 9, 1988 [JP] Japan ................................. 63-142673

[51] Int. Cl.⁵ ...................... H01L 21/302; B44C 1/22
[52] U.S. Cl. .................................. 156/643; 156/646; 156/668
[58] Field of Search ...................... 204/192.32, 192.35, 204/192.36; 156/643, 646, 659.1, 668

[56] References Cited

U.S. PATENT DOCUMENTS

| | | | |
|---|---|---|---|
| 3,837,856 | 4/1974 | Irving et al. | 96/36.2 |
| 4,462,863 | 7/1984 | Nishimatsu et al. | 156/643 |
| 4,501,061 | 2/1985 | Wonnacott | 156/643 X |
| 4,529,860 | 7/1985 | Robb | 156/643 X |
| 4,579,623 | 4/1986 | Suzuki et al. | 156/643 X |
| 4,699,689 | 10/1987 | Bersin | 156/646 X |

FOREIGN PATENT DOCUMENTS 0304046 2/1989 European Pat. Off. .
0305946 3/1989 European Pat. Off. .
EDD-88-47 1/1988 Japan .

OTHER PUBLICATIONS

Krogh Ole et al., "Spectroscopic Diagnostics of Photoresist Erosion in an Aluminum Etch Plasma," *Journal of the Electrochemical Society*, vol. 134, No. 8 (Aug. 1987), pp. 2045–2048.

Primary Examiner—Nam X. Nguyen
Attorney, Agent, or Firm—Armstrong, Nikaido, Marmelstein, Kubovcik & Murray

[57] ABSTRACT

Plasma ashing methods, for moving a resist material formed on a ground layer of a semiconductor device during fabrication of said semiconductor, are performed by using one of three kinds of reactant gases each composed of three different gases. Plasma ashing is performed: at an ashing rate of 0.5 μm/min at 160° C. and with an activation energy of 0.4 eV when a reactant gas composed of oxygen, water vapor and nitrogen is used; at an ashing rate of 0.5 μm/min at 140° C., with an activation energy of 0.38 eV and without etching the ground layer when a reactant gas composed of oxygen, water vapor and tetrafluoromethane is used; and at an ashing rate of 0.5 μm/min at 140° C., with an activation energy of 0.4 eV when a reactant gas composed of oxygen, hydrogen and nitrogen is used.

7 Claims, 13 Drawing Sheets

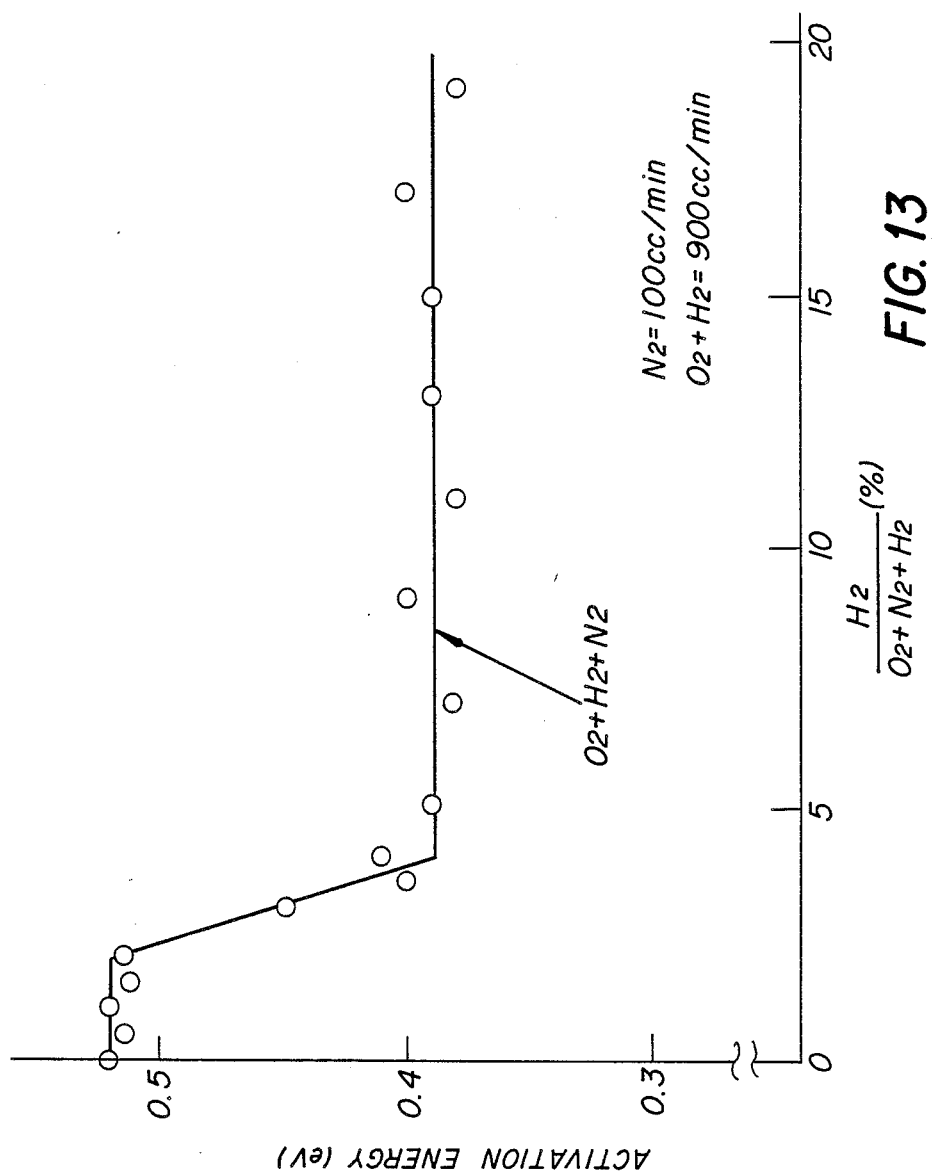

ASHING METHOD FOR REMOVING AN ORGANIC FILM ON A SUBSTANCE OF A SEMICONDUCTOR DEVICE UNDER FABRICATION

BACKGROUND OF THE INVENTION

1. Field of the Invention

The present invention relates to a method of removing an organic material used on a semiconductor device, and particularly the present invention relates to an ashing method of removing an organic film temporarily formed on a substrate of a semiconductor device during fabrication.

An organic film, such as a resist or a polyamide film temporarily formed on a substrate, which is a part of a semiconductor device, as part of the process of fabricating the semiconductor device has in the past been removed by an ashing method using an oxygen plasma. Removing the resist film is an important part of the process of fabricating a semiconductor device. Removing the resist film, as an organic film, will be described hereinafter. Since the semiconductor device is very small as compared to a Large Scale Integrated circuit device (LSI) or a Very Large Scale Integrated circuit device (VLSI) in which it is used, the resist film, which will be called simply the "resist" hereinafter, is hard to remove, by the usual ashing method using the oxygen plasma, without damaging the devices. During the process of ion implantation and dry etching, which are widely used in process of fabricating process of LSIs or VLSIs, the properties of the resist are substantially changed, causing the ashing rate of the resist to be slow, so that a long time is required to ash the resist. Since resists are used many times in the process of fabricating LSIs or VLSIs, the ashing rate for each resist should be high in order to improve the throughput of the fabrication process.

A layer, called simply a "ground layer" hereinafter, upon which the resist is formed, is usually made of material, such as silicon dioxide ($SiO_2$), polysilicon (Si) or aluminum (Al). Generally, the resist is not easily etched intentionally by the ashing method. In other words, the resist is hard to etch precisely so as to be able to remove only the resist without damaging any of the ground layer in the ashing process. Therefore, when an ashing method is used in the process of fabricating LSIs or VLSIs, great attention must be paid to leaving the ground layer as it is, because the ground layer of the LSI or the VLSI is very thin and not even a small part of it can be permitted to be etched.

There are many kinds of plasma ashing methods for removing a resist film which has been provided on an insulating layer in a semiconductor. The most widely used is a down-flow ashing method because, applying the down-flow ashing method to the plasma ashing process, damage caused by charged particles can be avoided. The down-flow ashing rate generally depends on the temperature, which will hereinafter be called the "ashing temperature", of the resist, such that the ashing rate decreases with a decrease in the ashing temperature. The ashing rate is usually expressed by the well known Arrhenius plot by which the ashing rates are plotted in a line against the inverse numbers of the respective ashing temperatures. In the Arrhenius plot, the gradient of the line gives the activation energy for ashing such that, when the ashing rate decreases rapidly with the decrease of the ashing temperature, the activation energy is large, and such that, when the ashing rate changes only little with the decrease of the ashing temperature, the activation energy is small. In this process, a small activation energy is desirable because ashing can then be performed almost independently of the ashing temperature. In other words, where the activation energy is small, ashing can be performed in a stable and precise manner Recently, there has been a tendency to use a process for fabricating semiconductor devices performed at lower temperatures, in accordance with the trend of miniaturization of devices as in the LSI or the VLSI. It is desirable to perform the ashing process at a temperature lower than 300° C., most preferably lower than 200° C., to avoid contamination from the resist. In order to maintain a high ashing rate at such low temperatures, higher than $0.5\mu$/min for practical use, the activation energy of the ashing rate must also be low. The activation energy of the ashing rate can be changed to some extent by changing the particular reactant gases used for ashing. The selection of the reactant gases, and particularly the use of combinations of such gases, is very important in order to provide high rates and low activation energies, and to precisely etch the resist, while leaving the ground layer as unchanged as possible and for minimizing damage. The selection and the combination of the reactant gases has been studied energetically.

2. Description of the Related Art

Downflow ashing is performed in a downflow of microwave plasma using a microwave plasma resist stripper. This is fully disclosed in a paper titled "Heavy Metal Contamination From Resists during Plasma Stripping" by Shuzo Fujimura and Hiroshi Yano, in Elect. Chem. Soc. Vol. 135, No. 5, May 1988.

The downflow microwave plasma resist stripper comprises a vacuum chamber including a plasma generating chamber, a vacuum pump for exhausting gas in the vacuum chamber, a process chamber including a pedestal on which a sample wafer is placed and a microwave power source. A reactant gas is supplied to the process chamber through the plasma generating chamber.

Then, a reactant gas plasma is generated in the plasma generating chamber by microwaves, so that active species for ashing in the gas plasma proceed to flow down to the process chamber and react with a resist, which has previously been formed on the sample wafer, so as to remove the resist.

In the downflow ashing process, oxygen has long been used as the reactant gas as described before. However, when only oxygen is used, the ashing rate is low and the activation energy is high, so that downflow ashing, using only oxygen, was hard to apply to the process of fabricating LSIs or VLSIs. Therefore, many other reactant gases have been studied as a means to increase the ashing rate and decrease the activation energy. It has even been studied to combine other kinds of gases with oxygen. As a result, several kinds of effective reactant gases have been found as will be described below, giving four examples, a first, a second, a third and a fourth examples, tracing the development of these new reactant gases. Hereinafter, the ashing rate and the activation energy are shown to be related to removing the resist film provided on a semiconductor device by the plasma ashing method.

A first reactant gas was a mixed gas of oxygen ($O_2$) with a halogenide gas, such as tetrafluoromethane ($CF_4$). The first reactant gas was most commonly used because it had a high ashing rate. FIG. 1 shows the ashing rate for commercially available photoresist (OFPR-800, TOKYO-OHKA) plotted against the variation of proportion of tetrafluoromethane in the mixed gas, as measured by the flow rate of tetrafluoromethane to the mixed gas at room temperature. Hereinafter, the ashing rate in the case using a particular reactant gas is simply called the ashing rate with the reactant gas. In FIG. 1, when as much as 15% tetrafluoromethane is added to oxygen, the ashing rate reaches a maximum value of 1.5 $\mu$m/min at 25° C., which is high enough for practical use. However, the ground layer, such as $SiO_2$, polysilicon (Si) or Al, is also etched because of fluorine (F) which is found mixed in the first reactant gas. On the other hand, when this first reactant gas is used, the activation energy is drastically reduced to a value of 0.1 eV from 0.52 eV, which is about the same activation energy found when using only oxygen. Such large decrease of the activation energy is due to the tetrafluoromethane, which was explained in the paper, J. J. Hannon and J. M. Cook, J. Electrochem. Soc., Vol. 131, No. 5, pp 1164 (1984).

A second reactant gas was a mixed gas of oxygen and nitrogen ($N_2$), not containing fluorine (F), which did not etch the ground layer. The ashing rate and the concentration of oxygen atom in the a down-flowed gas were measured by varying the flow ratio of nitrogen to the second reactant gas as shown in FIG. 2; wherein, the concentration of oxygen atom was measured by an actinometry method. In this case, the ashing temperature was 200° C. and the flow rate of the second reactant gas was 1000 Standard Cubic Centimeters per Minute (SCCM). In FIG. 2, white circles represent the concentrations of oxygen atom, obtained from the spectral intensity ratio of the radiation from an oxygen atom (at a wavelength of 6158 Å) to the radiation from an argon atom (at a wavelength of 7067 Å), and triangles represent the concentrations of the same oxygen atom, obtained from the spectral intensity ratio of the radiation from an oxygen atom (at a wave length of 4368 Å) to the radiation from an argon atom (at a wavelength of 7067 Å). Further, the values of these concentrations are normalized by a maximum of the values of the concentrations, positioned at about 10% of the flow ratio of nitrogen to the second reactant gas. Multiplication signs represent the ashing rates at the respective flow ratios of nitrogen to the second reactant gas. As can be seen from FIG. 2, the curve of the ashing rate and that of the concentration of oxygen atom coincide with each other, which means that oxygen atoms are only effective in performing the ashing. FIG. 3 shows an Arrhenius plot of the ashing rate when the second reactant gas contains 90% of oxygen and 10% of nitrogen in the mixture and an Arrhenius plot of the ashing as accomplished with oxygen gas only. The ashing temperature is denoted by T. The ashing rate of the second reactant gas is plotted by a circle and the ashing rate of the oxygen is plotted by a multiplication sign. The ashing rate with the second reactant gas is about two times of that of oxygen alone. Hereinafter, the activation energy of ashing, in the case of using a reactant gas, is simply called the activation energy of the reactant gas. The activation energy (Ea) of the second reactant gas, and that of oxygen are equally 0.52 eV. That is, the activation energy did not change by mixing nitrogen with oxygen. The ashing rate of the second reactant gas, of 0.2 $\mu$m/min at 160° C., is too small for practical use. In order to increase the ashing rate, another kind of gas was needed.

The third reactant gas was a mixed gas of oxygen and water vapor ($H_2O$) which did not etch the ground layer. The ashing rate and concentration of oxygen atoms were measured by varying the flow ratios of water vapor to the third reactant gas as shown in FIG. 4. The measurements were performed at 180° C. ashing temperature and 1000 SCCM flow rate of the third reactant gas. Circles and multiplication signs in FIG. 4 represent the same as in FIG. 2, respectively. When the flow ratio of water vapor to the third reactant gas exceeded 40%, the concentration of oxygen atoms decreased with an increase of the water vapor flow ratio. However, the ashing rate did not decrease as much as the decrease of the concentration of oxygen atom, as seen in FIG. 4. This means that some active species, other than oxygen atoms, are possibly taking part in the ashing. FIG. 5 compares the Arrhenius plot of the third reactant gas, containing 60% of oxygen and 40% of water vapor, and Arrhenius plot of oxygen gas alone. The ashing rate of the third reactant gas, having 40% flow ratio of water vapor, is plotted by triangles and the ashing rate of the oxygen alone is plotted by multiplication signs. The activation energy of the third reactive gas is 0.39 eV, which is about three quarters of the activation energy (0.52 eV) of oxygen alone, as shown in FIG. 6. FIG. 6 shows the activation energy of ashing in the case of using a third reactant gas by varying the flow ratios of water vapor to the third reactant gas, by white circles. In FIG. 6, the activation energy of ashing in the case using a mixed gas of oxygen and hydrogen, by varying the flow ratio of hydrogen to the mixed gas, is shown by solid circles for the sake of comparison. FIG. 6 shows that the activation energy is easily reduced by adding a little water vapor and the activation energy is constant independent of the flow ratio of water vapor when the flow ratio of water vapor to oxygen exceeds 5%. The activation energy of the second reactant gas is also indicated by a dot chain line in FIG. 6 for comparison with the third reactant gas. It is seen from this comparison that the activation energy does not change by adding nitrogen to oxygen. Behavior similar to the mixed gas of oxygen and water vapor is seen for the mixed gas of oxygen and hydrogen. On the other hand, the ashing rate of the third reactant gas is about 0.22 $\mu$m/min at 160° C., as seen in FIG. 5. It has been concluded that the value of the ashing rate of the third reactant gas is still too small for practical use.

The fourth reactant gas is a mixed gas of oxygen, nitrogen and tetrafluoromethane. The fourth reactant gas is disclosed in the Japanese laid-open patent application, SHO 63-102232, titled "DRY ETCHING APPARATUS" by Mikio Nonaka. When the flow ratio of tetrafluoromethane and nitrogen are in the range of 5 to 20% and 5 to 10% respectively, a large ratio of the rate of etching a positive resist to the rate of etching a ground layer is obtained without decreasing the ashing rate. However, the etching of ground layer cannot be avoided in this case.

A mixed gas made by adding as little as 0.2% of hydrogen to a mixed gas of oxygen, nitrogen and tetrafluoromethane is commercially available from EMERGENT TECHNOLOGIES CO. (Phoenix 2320 NORD Photoresist Stripper). In this case, the hydrogen diluted by nitrogen is added in order to improve matching with microwave power. That is, adding hydrogen to the mixed gas is not for reduction of the activation energy.

So, the mixed gas is essentially the same as the first reactant gas. In fact, it is also known that the activation energy of the second reactant gas mixed with hydrogen does not decrease until there has been added about 0.5% of hydrogen.

As seen from the description of the first, second, third and fourth reactant gases, an ideal mixed gas, having a high ashing rate and low activation energy and never etching the ground layer, has not been found although much has been studied on new reactant gases.

SUMMARY OF THE INVENTION

Accordingly, an object of the present invention is to improve the ashing process for removing an organic film formed on a ground layer of a semiconductor device during fabrication, such that the ashing rate increases, the activation energy decreases and the ground layer is never etched in the ashing process.

The above object is achieved by using as the reactant gas in the ashing process, one comprising at least three kinds of gases. The reactant gas is separated into two groups of mixed gases: one (a first group gas) of which comprises at least oxygen and water vapor, and the other (a second group gas) of which comprises at least oxygen and hydrogen. As is well known, the oxygen in each group gas is the main gas for performing the ashing, however water vapor in the first group gas and hydrogen in the second group gas are mainly for decreasing the activation energy, increasing the ashing rate and avoiding the ground layer being etched in cooperation with another third gas respectively added to the first group gas and the second group gas. The third gas added to the first group gas is hydrogen, nitrogen, nitrogen oxide or halogenide, and that added to the second group gas is water vapor, nitrogen, nitrogen oxide or halogenide. The halogenide includes tetrafluoromethane ($CF_4$), chlorine ($Cl_2$), nitrogen trifluoride ($NF_3$), hexafluoroethane ($C_2F_6$) and methyltrifluoride ($CHF_3$). The flow rate of the water vapor and the third gas of the first group gas and that of the hydrogen and the third gas of the second group gas are controlled respectively.

In the first group gas including a third gas of nitrogen, the water vapor added to the oxygen has the same effect of that described in reference to FIG. 5, and the added nitrogen has the same effect of that described in reference to FIG. 3. However, in the first group gas including a third gas of nitrogen, the added water vapor and nitrogen produce a synergistic effect of increasing the ashing rate and decreasing the activation energy. That is, it was simply assumed from FIGS. 3 and 5 that the ashing rate of the first group gas, including the third gas of nitrogen, would increase in the same way as the case of a gas of only mixed oxygen and nitrogen, and the activation energy of the first group gas, including a third gas of nitrogen, would increase in the same way as the case of a gas of only mixed oxygen and nitrogen, and the activation energy of the first group gas, including a third gas of nitrogen, would decrease in the same way as the case of a gas of only mixed oxygen and water vapor. However, actually, the ashing rate increased as much as two times the value to be assumed from FIG. 3 though the activation energy only decreased to a value approximately same as the value assumed from FIG. 5.

The first group gas, including a third gas of halogenide such as tetrafluoromethane, is excellent as a reactant gas. Recently, halogenide has not been used as the third gas in the fabrication of LSIs or VLSIs because of the disadvantage that halogen easily etches the ground layer. However, according to experiments made by the inventors, it has found that the first group gas, including a third gas of halogenide, surprisingly does not etch the ground layer when water vapor is included in the reactant gas, supplied by a flow ratio controlled so as to exceed a designated value. While it is not known why this takes place, it is believed that it is because the halogen atoms appear to react with the hydrogen atoms of the water molecules. As the result, the action of the halogen is suppressed. Using the first group gas, including a third gas of halogen as the reactant gas, the ashing rate becomes large and the activation energy of the ashing rate becomes small, compared with a first group gas which includes a third gas of nitrogen.

As a second group gas, one including a third gas of nitrogen is discussed. According to experiments by the inventors, the activation energy is decreased to 0.44 eV from 0.52 eV (the activation energy corresponding to oxygen) by adding more than 3% hydrogen. This is because the hydrogen acts to decrease the activation energy. The ashing rate of the second group gas, including as a third gas nitrogen, is as much as two or three times higher than that of the usual mixed gas of oxygen and nitrogen.

These mixed gases, described above, of a first group gas including nitrogen as the third gas, a first group gas including halogenide as the third gas, and a second group gas, have three advantages of having high ashing rates, having low activation energies and causing no ground layer etching in the process of fabricating LSIs or VLSIs.

BRIEF DESCRIPTION ON THE DRAWINGS

Figure 10:
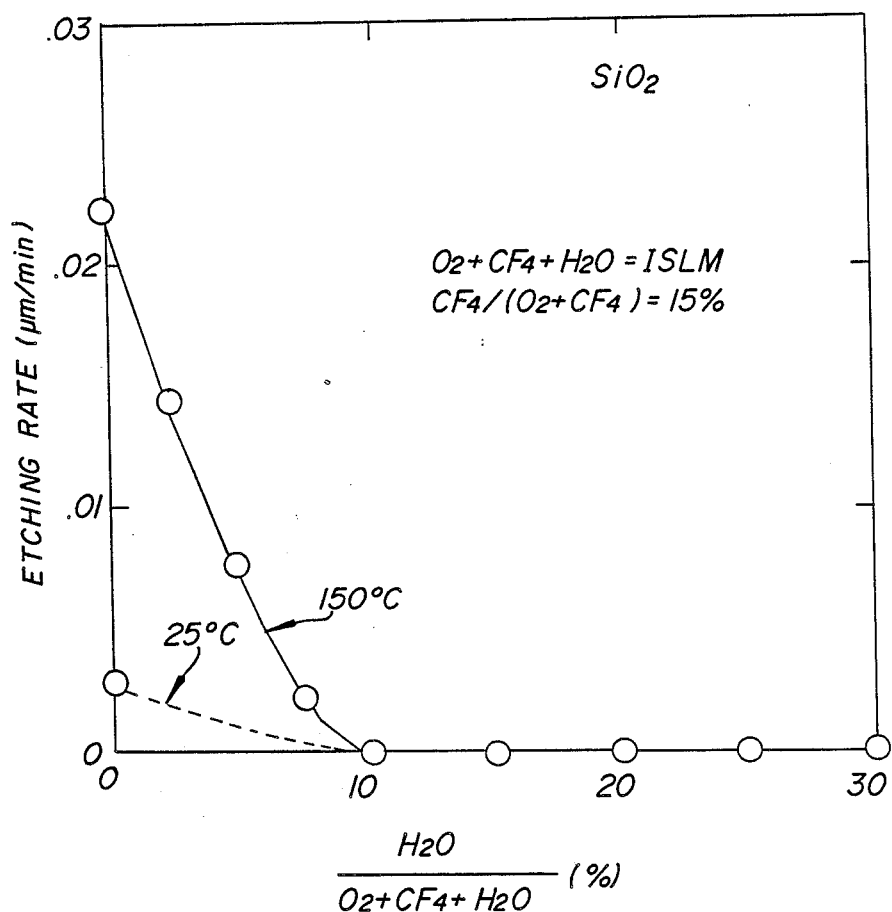

FIG. 10 is a graph showing variations of the rate of etching $SiO_2$ ground layer at 150° C. and 25° C. ashing temperature with flow ratio of $H_2O$ to the mixed gas, in the case of performing plasma ashing using a reactant gas composed of $O_2$, $H_2O$ and $CF_4$ at 25° C., 150° C. and 180° C. ashing temperature with a flow ratio of $H_2O$ to the reactant gas, where 15% flow ratio of $CF_4$ to the mixed gas of $O_2$ and $CF_4$ is used.

Figure 11:
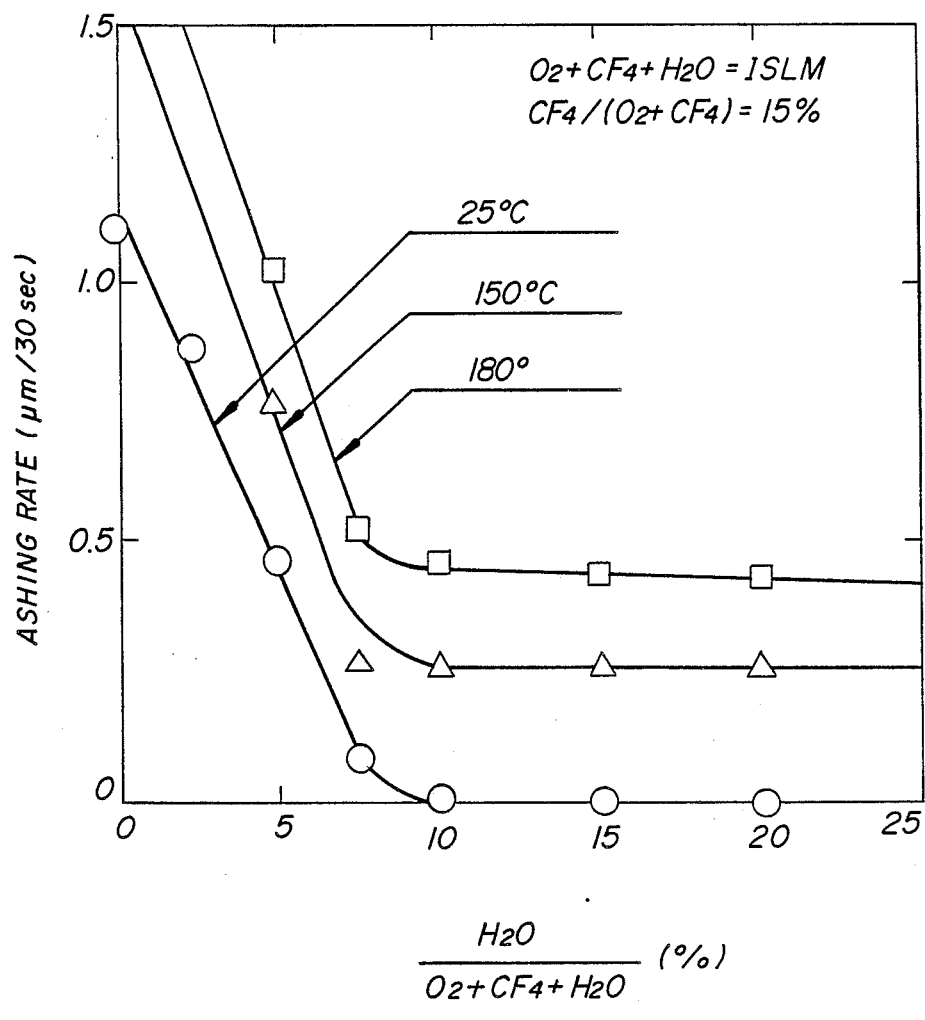

FIG. 11 is a graph showing the variations of the ashing rate for resist in the case of using the reactant gas composed of $O_2$, $H_2O$ and $CF_4$ at 25° C., 150° C. and 180° C. ashing temperature with flow ratio of $H_2O$ to the reactant gas, where 15% flow ratio of $CF_4$ to the mixed gas of $O_2$ and $CF_4$ is kept.

Figure 12:
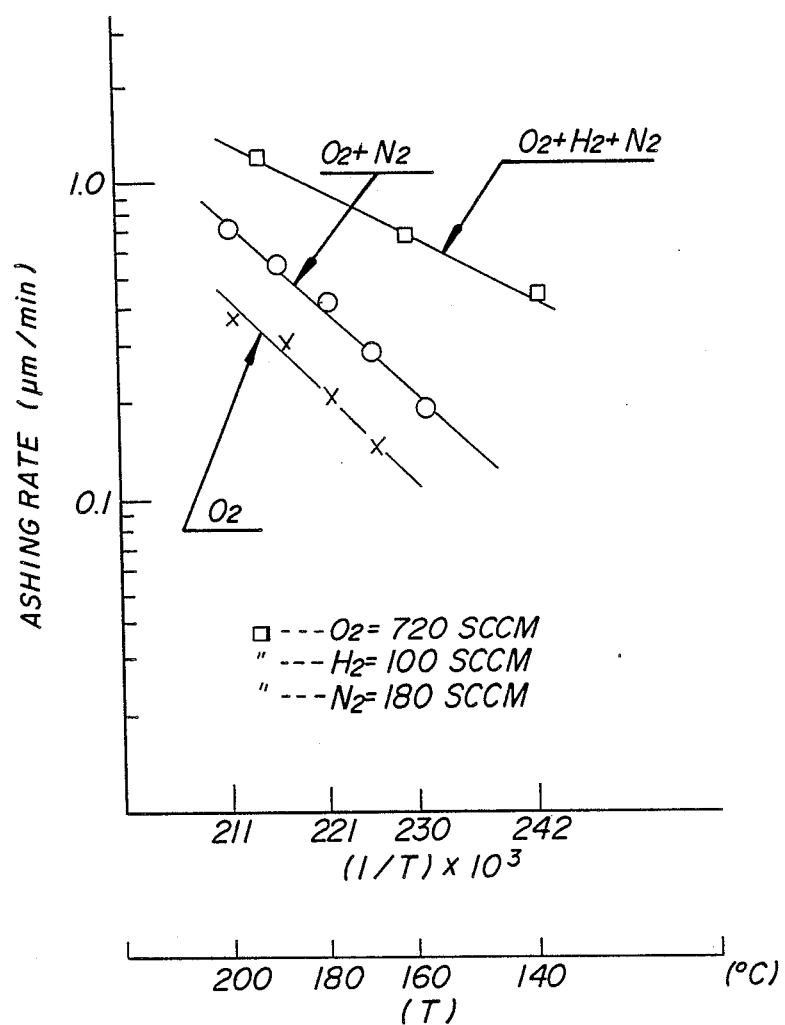

FIG. 12 is a graph showing Arrhenius plots of the ashing rate for resist in the case of using a reactant gas composed of $O_2$, $H_2$ and $N_2$, a reactant gas composed of $O_2$ and $N_2$ and a reactant gas composed of oxygen.

FIG. 13 is a graph showing variations of the activation energy of ashing using a reactant gas composed of $O_2$ and $H_2O$ and a reactant gas composed of $O_2$ and $H_2$, with a flow ratio of $H_2O$ to the reactant gas of $O_2$ and $H_2O$ and with a flow ratio of $H_2$ to the reactant gas of $O_2$ and $H_2$, respectively.

DESCRIPTION OF THE PREFERRED EMBODIMENTS

The plasma ashing methods of removing resist, using three kinds of reactant gases will be described as the embodiments of the present invention with reference to FIGS. 8 to 12. The embodiments are separated into three, a first, a second and a third embodiment, as a function of the three kinds of the reactant gases. Plasma ashing was performed by a down flow ashing method using a conventional downflow microwave plasma resist stripper schematically shown in FIG. 7.

THE FIRST EMBODIMENT

Figure 7:
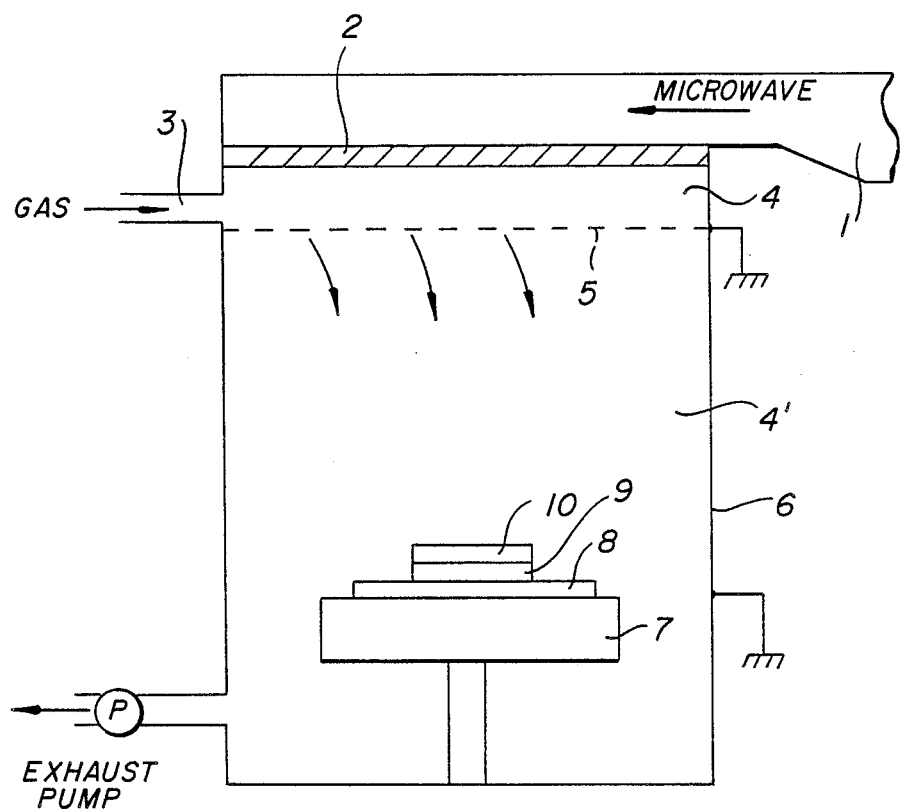
FIG. 7 is a schematical drawing of a vacuum chamber of a down-flow ashing apparatus.

The first embodiment is the plasma ashing method using a reactant gas composed of $O_2$, $H_2$ and $N_2$. In FIG. 7, the reactant gas composed of 720 SCCM $O_2$, 100 SCCM $H_2O$ and 180 SCCM $N_2$ is supplied to an initially exhausted vacuum chamber 6 through a gas inlet 3, keeping the gas pressure in the vacuum chamber 6 at about 0.8 Torr. The flow rates of the gases of $O_2$, $H_2$ and $N_2$ are controlled respectively by a controller, not depicted, before the gases flow into the vacuum chamber 6. Through a wave guide 1 and a window 2, microwave power of 2.45 GHz is supplied into a plasma generating chamber 4. Plasma is generated with the reactant gas in the plasma generating chamber 4 and the charged particles in the plasma are trapped by a shower plate 5. Then, only neutral active species, generated in the plasma, flow down to a process chamber 4' through the holes provided in a showerhead plate 5 and touch a surface of a resist 10 formed on a ground layer 9 of a sample wafer 8 placed on a stage 7 heated to 140° C. by a heater, not depicted. As a result, the resist 10 is etched until the surface of the ground layer 9 appears while not etching any part of the ground layer. Because the reactant gas does not contain halogen, the ground layer 9 is never etched.

Figure 8:
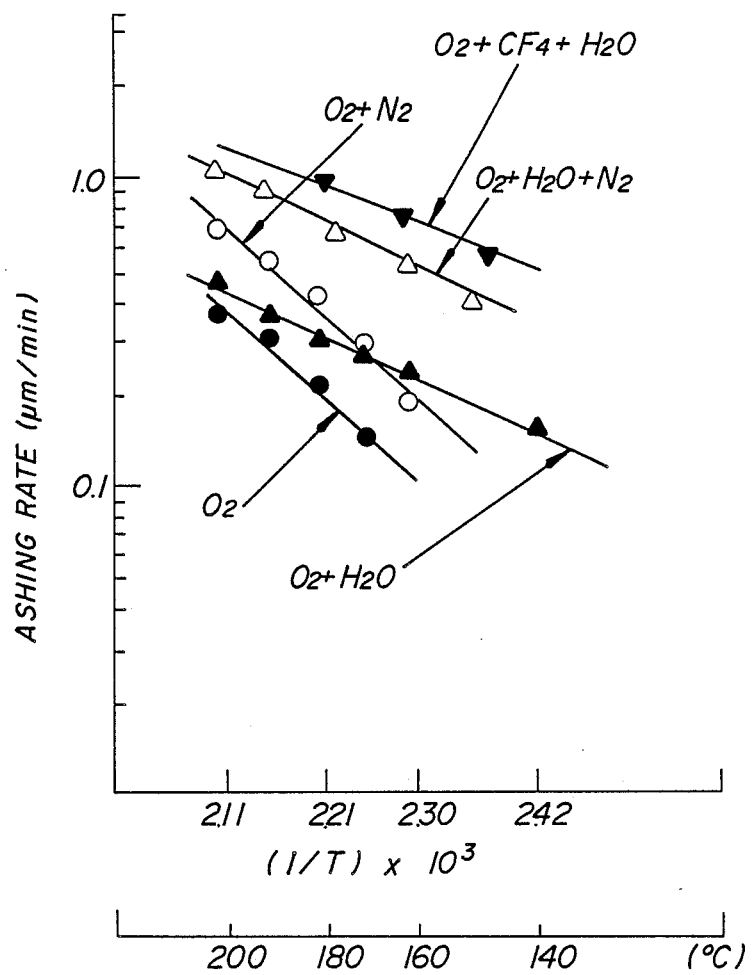
FIG. 8 is a graph of Arrhenius plots showing the ashing rates for resist in the case of using different kinds of reactant gases.
Figure 9:
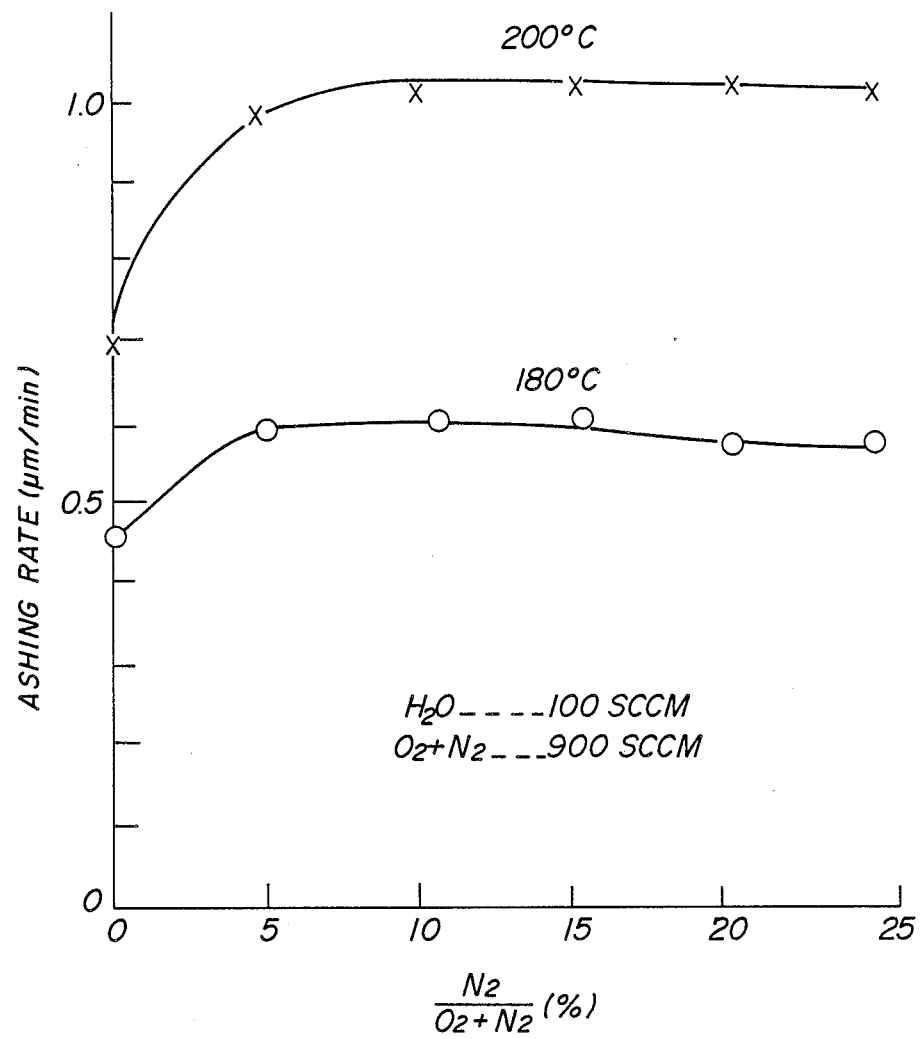
FIG. 9 is a graph showing the variations of the ashing rate in the case of using a reactant gas composed of $O_2$, $H_2O$ and $N_2$ at 180° C. and 200° C. ashing temperatures with a flow ratio of $N_2$ to the mixed gas of $O_2$ and $N_2$, where the flow rate of $H_2O$ is kept constant.

The ashing rate, in the case of using a reactant gas composed of $O_2$, $H_2$ and $N_2$, is shown by a line connecting open triangles in FIG. 8 representing an Arrhenius plot. In FIG. 8, the ashing rates in the case of using several other kinds of reactant gases are also shown in the same way, for the sake of comparison. That is, the ashing rate in the case of using a reactant gas composed of only $O_2$, that of using a reactant gas composed of $O_2$ and $H_2O$ and that of using a reactant gas composed of $O_2$ and $N_2$ are shown by solid circles, solid triangles and open circles, respectively. As seen in FIG. 8, the ashing rate, in the case of using a reactant gas of $O_2$, $H_2O$ and $N_2$, is larger than the ashing rate in the cases of using a reactant gas composed of only $O_2$, of $O_2$ and $H_2O$, or of $O_2$ and $N_2$. The reactant gas composed of $O_2$, $H_2$ and $N_2$ has an ashing rate of 0.5 $\mu$m/min at 160° C. ashing temperature and an activation energy of 0.4 eV. For practical use, the 0.5 $\mu$m/min ashing rate is large enough and the 0.4 eV activation energy is small enough. FIG. 9 shows the variation of the ashing rate for the various flow ratios of $N_2$ to the mixed gas of $O_2$ and $N_2$, at an ashing temperatures of 180° C. and 200° C., keeping the flow rate of $H_2O$ at 100 SCCM and the total flow rate of $O_2$ and $N_2$ at 900 SCCM. It can be seen in FIG. 9 that the ashing rate in the case of using a reactant gas composed $O_2$, $H_2O$ and $N_2$ is hardly changed by varying the flow ratio of nitrogen to the mixed gas of $O_2$ and $N_2$ when the flow ratio is larger than 5%. Therefore, the reactant gas of mixed $O_2$, $H_2O$ and $N_2$, having a nitrogen flow ratio larger than 5%, can be also used as the reactant gas for performing a precise ashing process.

Figure 1:
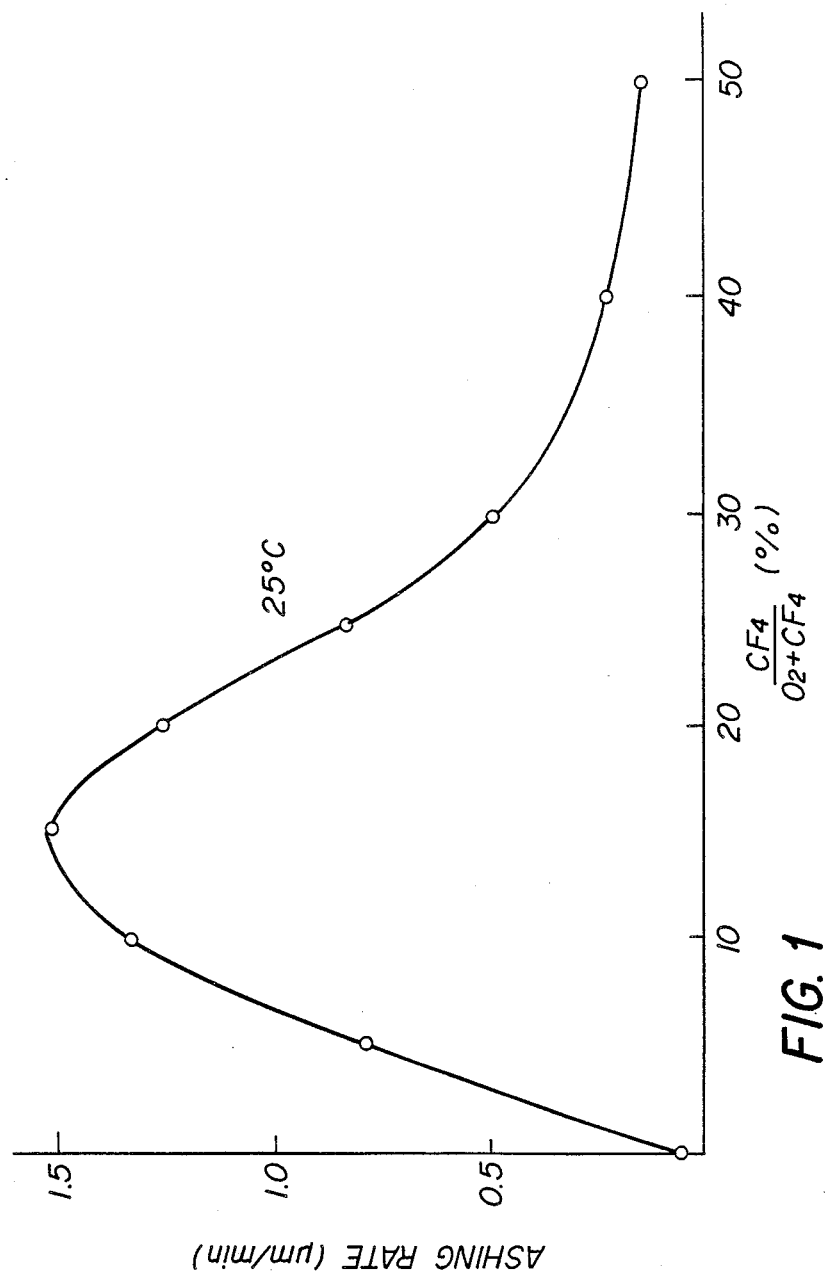
FIG. 1 is a graph showing the variation of the ashing rate for resist in the case of using a reactant gas composed of $O_2$ and $CF_4$ as a function of the flow ratio of $CF_4$ to the reactant gas, at 25° C. ashing temperature.
Figure 2:
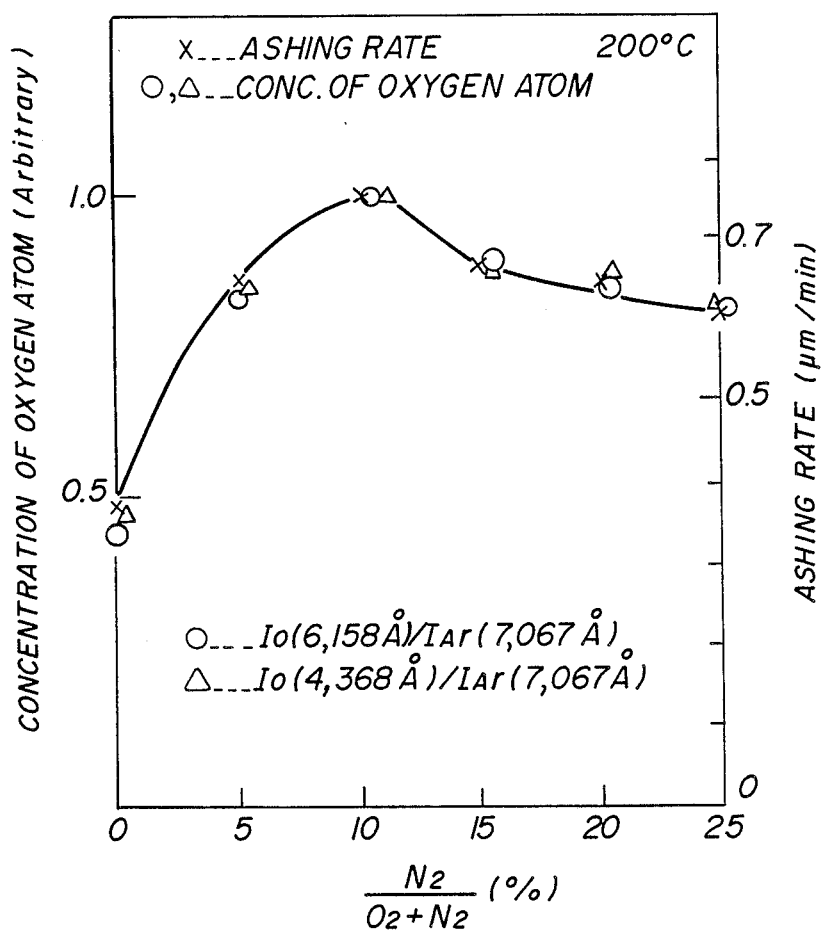
FIG. 2 is a graph showing the variation of the ashing rate for resist in the case of using a reactant gas composed of $O_2$ and $N_2$ at 200° C. ashing temperature and the variation of the concentration of oxygen atom in a down-flowed gas with the flow ratio of $N_2$ to the reactant gas.
Figure 3:
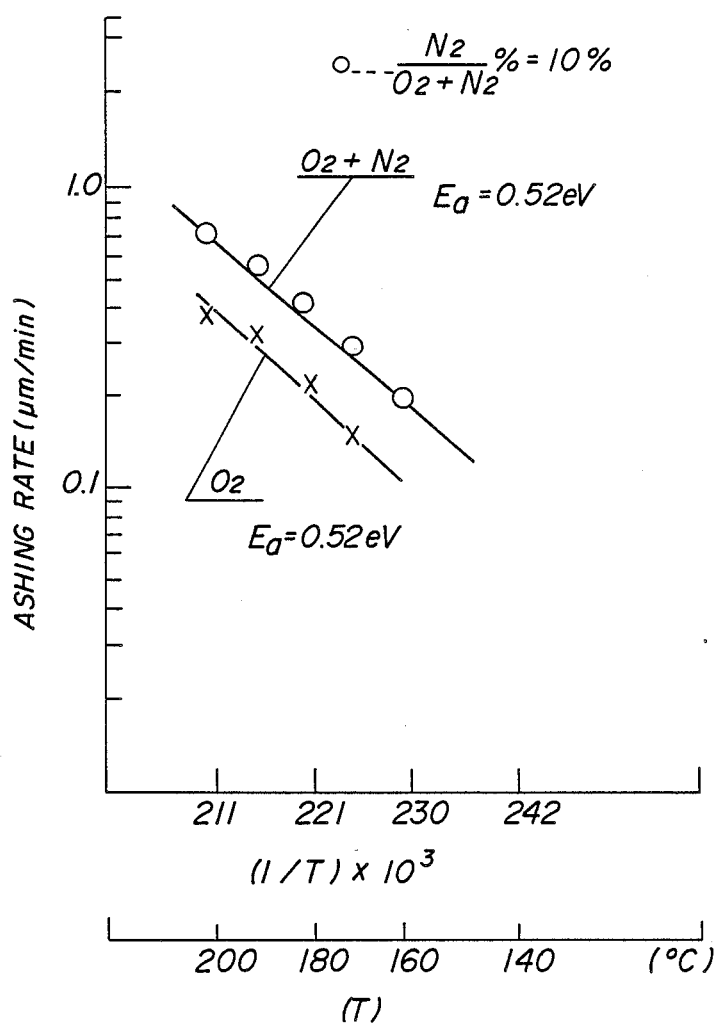
FIG. 3 is a graph showing Arrhenius plots of the ashing rate for resist in the case of using a reactant gas composed of 90% $O_2$, 10% $N_2$ and a reactant gas composed of oxygen.
Figure 4:
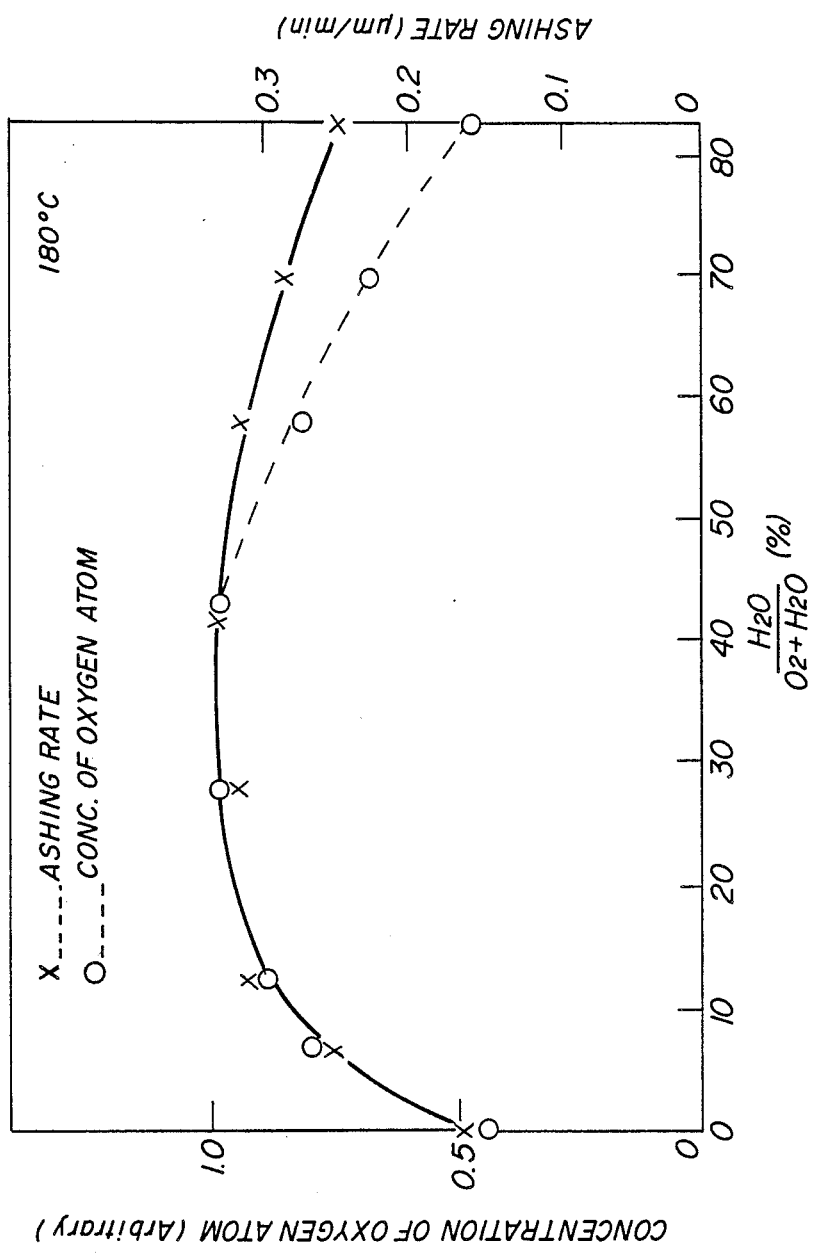
FIG. 4 is a graph showing the variation of the ashing rate in the case of using a reactant gas composed of $O_2$ and $H_2O$ at 180° C. ashing temperature and the variation of the concentration of oxygen atom in a down-flow gas with a flow ratio of $H_2O$ to the reactant gas.
Figure 5:
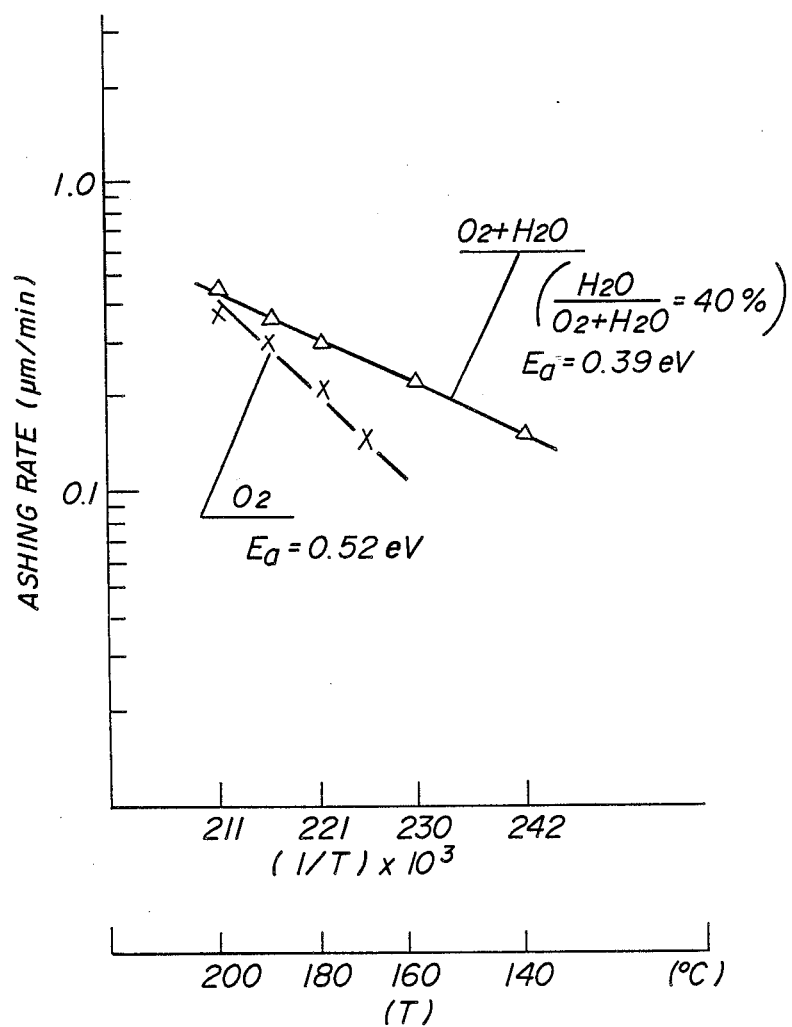
FIG. 5 is a graph showing Arrhenius plots of the ashing rate for the case of using a reactant gas composed of 60% $O_2$, 40% $H_2O$ and a reactant gas composed of oxygen.
Figure 6:
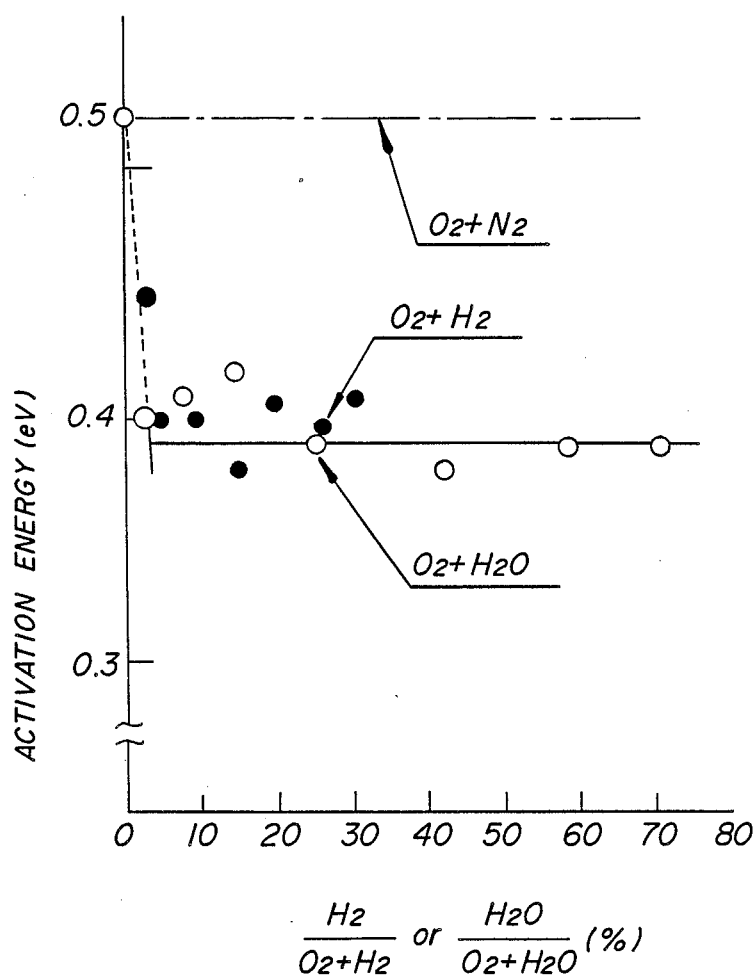
FIG. 6 is a graph showing the variation of the activation energy of ashing using a reactant gas composed of $O_2$ and $H_2O$ with a flow ratio of $H_2O$ to the reactant gas.

The flow rate of each component gas is set at 720 SCCM, 100 SCCM and 180 SCCM for $O_2$, $H_2O$ and $N_2$, respectively, as a desirable example. However, the flow rate of $N_2$ is not limited if the flow ratio of $N_2$ to the mixed gas of $O_2$ and $N_2$ is larger than 5%, because the ashing rate is constant regardless of the nitrogen flow ratio when it exceeds 5% as seen in FIG. 9. The flow rate of $H_2O$ is not limited if the flow ratio of $H_2O$ to the mixed gas of $O_2$ and $H_2O$ is larger than 1% because the activation energy is about 0.4 eV regardless of the water flow ratio when its flow ratio exceeds 1%, as seen in FIG. 6.

In the first embodiment, $NO_x$ or $H_2$ can be added to mixed gas of $O_2$ and $H_2O$ instead of $N_2$.

THE SECOND EMBODIMENT

In the second embodiment, a reactant gas composed of $O_2$, $H_2O$ and $CF_4$ is used for the plasma ashing. The ashing is performed in the same way as described in the first embodiment. The flow rates of $O_2$, $H_2O$ and $CF_4$ are 730 SCCM, 150 SCCM and 120 SCCM, respectively.

The disadvantage of etching the ground layer by using $CF_4$ can be avoided by maintaining the flow ratio of $H_2O$ to the reactant gas larger than 10% as shown in FIG. 10. FIG. 10 is a graph showing the etching rate, at 150° C. and 25° C. ashing temperature, of a ground layer made of $SiO_2$, with a flow ratio of $H_2O$ to the reactant gas, under a condition that the total flow rate of $O_2$, $H_2O$ and $CF_4$ is kept at 1000 SCCM and the flow rate of $CF_4$ to the mixed gas of $O_2 + CF_4$ is kept at 15%. From FIG. 10, it can be seen that when the flow ratio of $H_2O$ to the reactant gas exceeds 10%, the etching rate of the ground layer of $SiO_2$ becomes zero, in other words, the ground layer of $SiO_2$ is never etched. Thus, this 10% of $H_2O$ ratio is a very important percentage in order to avoid the ground layer being etched. Incidentally, when the $H_2O$ ratio to the reactant gas is 10%, it can be calculated from the above condition in FIG. 10, that the flow ratios of $O_2$ and $CF_4$ to the reactant gas are 76.5% and 13.5% respectively.

The ashing rate of a reactant gas composed of $O_2$, $H_2O$ and $CF_4$ is shown by a line connecting reversed solid triangles in FIG. 8. As shown in FIG. 8, the ashing rate is the largest, compared with other ashing rates, in the cases of using other reactant gases.

The ashing rate of a reactant gas composed of $O_2$, $H_2O$ and $CF_4$ was measured by varying the flow ratio of $H_2O$ to the reactant gas at 25° C., 150° C. and 180° C. ashing temperatures respectively, under a condition that the total flow rate of $O_2$, $H_2O$ and $CF_4$ was kept at 1000 SCCM and the flow ratio of $CF_4$ to the mixed gas of $O_2$ and $CF_4$ was kept at 15%. The results of the measurement are shown in FIG. 11, where it can be seen that when the flow ratio of $H_2O$ to the reactant gas exceeds 10%, the ashing rate is constant and independent of flow ratio of $H_2O$ to the reactant gas.

The flow rate of each component gas is set at 730 SCCM, 150 SCCM and 120 SCCM for $O_2$, $H_2O$ and $CF_4$, respectively, as a desirable example. However the flow rate of $H_2O$ is not limited if the number of hydrogen atoms derived from $H_2O$ is larger than the number of fluorine atoms liberated from $CF_4$. On the other hand, the flow ratio of $H_2O$ to the mixed gas of $O_2$ and $H_2O$ must be larger than 1%, so that the activation energy of ashing in the case of using the reactant gas is about 0.4 eV regardless of the flow ratio, as seen in FIG. 6.

In the second embodiment, $CF_4$ is used as a halogenide, however $Cl_2$, $NF_3$, $C_2F_6$ and $CHF_3$ can be used instead of $CF_3$.

THE THIRD EMBODIMENT

The third embodiment is a plasma ashing method using a reactant gas composed of $O_2$, $H_2$ and $N_2$. That is, the reactant gas composed of 720 SCCM $O_2$, 100 SCCM $H_2$ and 180 SCCM $N_2$ is applied to the downflow ashing process as described in the first embodiment.

In the case of using a reactant gas composed of $O_2$, $H_2$ and $N_2$, the ashing rate is shown by a line connecting open squares in FIG. 12, which represents an Arrhenius plot, and the activation energy is shown with a flow rate of $H_2$ to the reactant gas composed of $O_2$, $H_2$ and $N_2$ in FIG. 13.

In FIG. 12, the ashing rate, in the case of using a reactant gas composed of only $O_2$ and that of using a reactant gas composed of $O_2$ and $N_2$, are also shown by a line connecting multiplication signs and a line connecting open circles respectively, for the sake of the comparison with a reactant gas composed of $O_2$, $H_2$ and $N_2$. In the case of using the reactant gas composed of $O_2$, $H_2$ and $N_2$, the ashing rate is about 0.7 $\mu m/min$ at 160° C. ashing temperature as shown in FIG. 12, and the activation energy is about 0.4 eV as shown in FIG. 13.

From consideration of FIG. 13, it is clear that the activation energy rapidly decreases to a value of approximately 0.4 eV as the flow ratio is increased from 0% to approximately 5% and stays constantly at a value of about 0.4 eV in a region where the flow ratio is higher that 5%. Plasma ashing is actually carried out in this constant region of activation energy. In FIG. 13, it can be seen that the characteristic of having substantially constant activation energy is very important for performing plasma ashing in a stable and precise manner.

The flow rate of each component of the gas is set at 720 SCCM, 100 SCCM and 180 SCCM for $O_2$, $H_2$ and $N_2$, respectively. However, if the flow rate of the $H_2$ in the reactant gas is greater than 3%, the flow rate of the hydrogen is not limited because the activation energy of ashing, where this reactant gas is used, is about 0.4 eV regardless of flow rate , as seen in FIG. 13. The flow rate of $N_2$ is not limited if the flow rate of $N_2$ to the mixed gas of $O_2$ and $N_2$ is larger than 5%, because the ashing rate is constant, regardless of the flow rate, when the flow rate exceeds 5%, as seen in FIG. 9.

In the third embodiment, plasma ashing is performed by using a reactant gas of $O_2$, $H_2$ and $N_2$. However, it was confirmed that $H_2O$, $NO_x$ or halogenide can be used instead of $N_2$.

The first, second and third embodiments described above are related to removing the resist film by plasma ashing, however the present invention can be applied to removing any organic polymer film.

Though the reactant gases described in the first, second and third embodiments are composed of three kinds of gases, an inert gas, such as He, Ne or Ar, can be added to the reactant gases up to 7%.

What is claimed is:

1. A method for removing an organic material formed on a ground substance of a semiconductor device, comprising the steps of:
    providing a mixed reactant gas comprising oxygen, water vapor and an additional gas in a proportion relative to each other such that upon forming said mixed gas into a plasma and impinging said plasma upon a surface containing said organic material to be ashed under ashing conditions, the ashing rate is higher than it would be if the reactant gas was composed of only oxygen and water and the activation energy is lower than it would be if the reactant gas was composed of only oxygen and water vapor;
    generating a first plasma of said mixed reactant gas providing a second plasma down stream of said first plasma for producing active species thereof; and
    impinging said second plasma on said organic material down stream from the making of said first plasma for a time and under condition sufficient to ash said organic material but insufficient to attack said ground substance.

2. A method according to claim 1, wherein said additional gas is at least one selected from the group consisting of hydrogen, nitrogen, nitrogen oxide, tetrafluoromethane, chlorine, nitrogen trifluoride, hexafluoroethane and trifluoromethane.

3. A method according to claim 2, wherein the additional gas is nitrogen and the ratio of water vapor to the sum of water vapor and oxygen is more than 1% and the ratio of nitrogen to the sum of nitrogen oxygen is more than 5%.

4. A method according to claim 3 wherein the temperature of the organic material is higher than 160° C. so as to obtain an ashing rate higher than 0.5 $\mu m/min$.

5. A method according to claim 2, wherein the additional gas is tetrafluoromethane in a ratio to the water vapor such that the number of hydrogen atoms in the water is at least as great as the number of halogen atoms in the tetrafluoromethane, and the ratio of water vapor to the sum of the water vapor and the oxygen is more than 1%.

6. A method according to claim 5 wherein the additional gas is selected from a halogenide group consisting of tetrafluoromethane, chlorine, nitrogen trifluoride, hexafluoroethane and trifluoromethane.

7. A method according to claim 5 wherein the temperature of the organic material is higher than about 140° C., so as to obtain an ashing rate larger than 0.5 $\mu m/min$.

* * * * *